United States Patent
Chang (10) Patent No.: US 10,997,386 B2
(45) Date of Patent: May 4, 2021

(54) IMAGE DATA TRANSMISSION SYSTEM AND IMAGE DATA TRANSMISSION METHOD

(71) Applicant: Guangzhou Tyrafos Semiconductor Technologies Co., LTD, Guangzhou (CN)

(72) Inventor: Keng-Li Chang, Taipei (TW)

(73) Assignee: Guangzhou Tyrafos Semiconductor Technologies Co., LTD, Guangzhou (CN)

( * ) Notice: Subject to any disclaimer, the term of this patent is extended or adjusted under 35 U.S.C. 154(b) by 89 days.

(21) Appl. No.: 16/419,025

(22) Filed: May 22, 2019

(65) Prior Publication Data

US 2020/0028977 A1 Jan. 23, 2020

(30) Foreign Application Priority Data

Jul. 23, 2018 (TW) .................................. 107125354

(51) Int. Cl.
*G06K 9/00* (2006.01)
*G02B 27/30* (2006.01)
(Continued)

(52) U.S. Cl.
CPC ......... *G06K 9/00013* (2013.01); *G02B 1/041* (2013.01); *G02B 3/0006* (2013.01);
(Continued)

(58) Field of Classification Search
CPC .. G06K 9/00013; G06K 9/209; G06K 9/0004; G06F 13/20; G06F 13/4282; G06F 2213/0002; G06F 13/385; G06F 13/4291; H04N 5/2352; H04N 5/2356; H04N 5/35536; H04N 5/378; H04N 5/35509;
(Continued)

(56) References Cited

U.S. PATENT DOCUMENTS

2010/0118153 A1* 5/2010 Yu ...................... H04N 5/23203
348/207.11
2011/0153900 A1* 6/2011 Zitlaw ................. G06F 13/1689
710/313

(Continued)

FOREIGN PATENT DOCUMENTS

TW 201301883 1/2013
TW I507027 11/2015

OTHER PUBLICATIONS

"Office Action of Taiwan Counterpart Application," dated Jul. 5, 2019, p. 1-p. 6.

*Primary Examiner* — Lin Ye
*Assistant Examiner* — Chan T Nguyen
(74) *Attorney, Agent, or Firm* — JCIPRNET (57) ABSTRACT

An image data transmission system and an image data transmission method are provided. The image data transmission system includes an image sensing device, a master device, and a serial transmission bus. The serial transmission bus electrically connects the image sensing device and the master device. The master device transmits a read command to the image sensing device through the serial transmission bus, and the image sensing device transmits a first data sequence to the master device through the serial transmission bus in response to the read command.

23 Claims, 9 Drawing Sheets

(51) Int. Cl.
    G02B 1/04       (2006.01)
    G02B 3/00       (2006.01)
    G02B 27/09      (2006.01)
    G02B 27/42      (2006.01)
    G03F 7/20       (2006.01)
    H01L 23/00      (2006.01)
    H01L 27/146     (2006.01)
    H04N 5/232      (2006.01)
    G06F 13/42      (2006.01)
    H04N 1/00       (2006.01)
    G06F 13/20      (2006.01)
    G09G 3/3225     (2016.01)
    H04N 1/21       (2006.01)
    H04N 5/235      (2006.01)
    G11C 11/412     (2006.01)
    G11C 11/419     (2006.01)
    H01L 27/11      (2006.01)
    H04N 5/353      (2011.01)
    H04N 5/355      (2011.01)
    H04N 5/3745     (2011.01)
    H04N 5/378      (2011.01)
    H04L 29/08      (2006.01)

(52) U.S. Cl.
    CPC ......... *G02B 27/0944* (2013.01); *G02B 27/30* (2013.01); *G02B 27/4233* (2013.01); *G03F 7/20* (2013.01); *G06F 13/20* (2013.01); *G06F 13/4282* (2013.01); *G06K 9/0004* (2013.01); *G09G 3/3225* (2013.01); *G11C 11/412* (2013.01); *G11C 11/419* (2013.01); *H01L 24/48* (2013.01); *H01L 27/1104* (2013.01); *H01L 27/14601* (2013.01); *H01L 27/14605* (2013.01); *H01L 27/14609* (2013.01); *H01L 27/14643* (2013.01); *H01L 27/14685* (2013.01); *H04N 1/00214* (2013.01); *H04N 1/2137* (2013.01); *H04N 5/2351* (2013.01); *H04N 5/2352* (2013.01); *H04N 5/2353* (2013.01); *H04N 5/2356* (2013.01); *H04N 5/232061* (2018.08); *H04N 5/3535* (2013.01); *H04N 5/35509* (2013.01); *H04N 5/35536* (2013.01); *H04N 5/35554* (2013.01); *H04N 5/35581* (2013.01); *H04N 5/378* (2013.01); *H04N 5/37452* (2013.01); *H04N 5/37455* (2013.01); *G06F 2213/0002* (2013.01); *G09G 2320/064* (2013.01); *G09G 2354/00* (2013.01); *H01L 2224/48091* (2013.01); *H04L 67/10* (2013.01); *H04N 2201/0084* (2013.01)

(58) Field of Classification Search
    CPC .......... H04N 5/35581; H04N 5/37452; H04N 5/37455; H04N 5/2351; H04N 5/3535; H04N 5/35554; H04N 1/2137; H04N 5/2353; H04N 5/232061; H04N 1/00214; H04N 2201/0084; H04N 5/232; G02B 1/041; G02B 3/0006; G02B 27/0944; G02B 27/4233; G02B 27/30; G02B 3/0068; G02B 6/32; G03F 7/20; G03F 7/70475; G03F 7/70491; G03F 7/70508; H01L 24/48; H01L 27/14601; H01L 27/14685; H01L 2224/48091; H01L 27/14605; H01L 27/14609; H01L 27/14643; H01L 27/1104; G09G 2320/064; G09G 2354/00; G09G 3/3225; H04L 67/10; Y02D 10/00; G11C 7/1096; G11C 7/24; G11C 11/412; G11C 11/419; H01S 5/0228; H01S 5/183; F21K 9/60
    USPC .................................................. 348/207.11
    See application file for complete search history.

(56) References Cited

U.S. PATENT DOCUMENTS

| 2013/0097369 A1* | 4/2013 | Talagala ............. G06F 12/0804 711/103 |
| 2014/0115209 A1* | 4/2014 | Heinrich ............. G06F 13/4291 710/110 |
| 2018/0091320 A1* | 3/2018 | Fujiwara ................ H04L 12/10 |
| 2019/0132353 A1* | 5/2019 | Rodniansky ........ H04L 63/0227 |

* cited by examiner

IMAGE DATA TRANSMISSION SYSTEM AND IMAGE DATA TRANSMISSION METHOD

CROSS-REFERENCE TO RELATED APPLICATION

This application claims the priority benefit of Taiwan application serial no. 107125354, filed on Jul. 23, 2018. The entirety of the above-mentioned patent application is hereby incorporated by reference herein and made a part of this specification.

BACKGROUND

Technical Field

The invention relates to a data transmission technique, and particularly relates to an image data transmission system and an image data transmission method.

Description of Related Art

Generally, an image sensor usually has parallel transmission pins for connecting other devices through a parallel transmission bus. After the image sensor completes an exposure operation and generates image data, the image sensor generally actively transmits the generated image data to the other device through the parallel transmission bus. Since the number of the parallel transmission pins is quite large, the cost of hardware design is increased.

Moreover, the aforementioned other device may only passively wait to receive the image data transmitted by the image sensor, and cannot decide when to start the image data transmission. Therefore, the aforementioned other device has to be in a standby state waiting to receive the image data at any time.

SUMMARY

The invention is directed to an image data transmission system and an image data transmission method, which are adapted to greatly reduce the number of pins of a transmission interface of an image sensor to decrease hardware cost of the image data transmission system, and let a master device in the image data transmission system grasps a time point at which the image sensor transmits image data.

The invention provides an image data transmission system. The image data transmission system includes an image sensing device, a master device, and a serial transmission bus. The serial transmission bus electrically connects the image sensing device and the master device. The master device transmits a read command to the image sensing device through the serial transmission bus, and the image sensing device transmits a first data sequence to the master device through the serial transmission bus in response to the read command.

The invention provides an image data transmission method, which is adapted to an image data transmission system. The image data transmission system includes an image sensing device, a master device, and a serial transmission bus. The image data transmission method includes following steps: transmitting a read command to the image sensing device by the master device through the serial transmission bus; and transmitting a first data sequence to the master device by the image sensing device through the serial transmission bus in response to the read command.

Based on the above, the image data transmission system and the image data transmission method adopt the serial transmission bus to serve as a transmission interface between the image sensing device and the master device, so as to greatly reduce the number of pins of the image sensing device. Besides, the master device is adapted to actively send the read command to the image sensing device, so as to grasp a time point for image data transmission.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In order to fully convey the spirit of the invention, exemplary embodiments are described in detail below with reference of the accompanying drawings. It will be apparent to those skilled in the art that various modifications and variations may be made to the structure of the present invention without departing from the scope or spirit of the invention after learning the exemplary embodiments of the invention. On the other hand, well-known components and steps are not described in the embodiments to avoid unnecessary limitations to the invention.

An image data transmission system of the invention includes a master device, an image sensing device and a serial transmission bus. The master device and the image sensing device performs image data transmission there between through the serial transmission bus, where the image sensing device serves as a slave device of the master device. The image sensing device may perform exposure to generate image data. Only when the mater device transmits a read command to the image sensing device, the image sensing device transmits the image data to the master device. In an embodiment of the invention, the master device may actively transmit commands to the image sensing device to set exposure related parameters of the image sensing device and a start time point when the image sensing device performs exposure, and instruct the image sensing device to provide image data, etc., and the image sensing device serving as the slave device completely passively receives commands from the master device, and performs corresponding operations according to the commands of the master device.

Figure 1A:
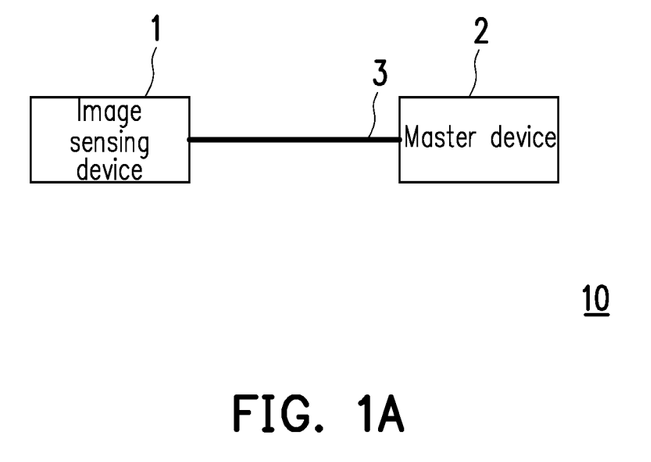
FIG. 1A is a block schematic diagram of an image data transmission system according to an embodiment of the invention.
Figure 1B:
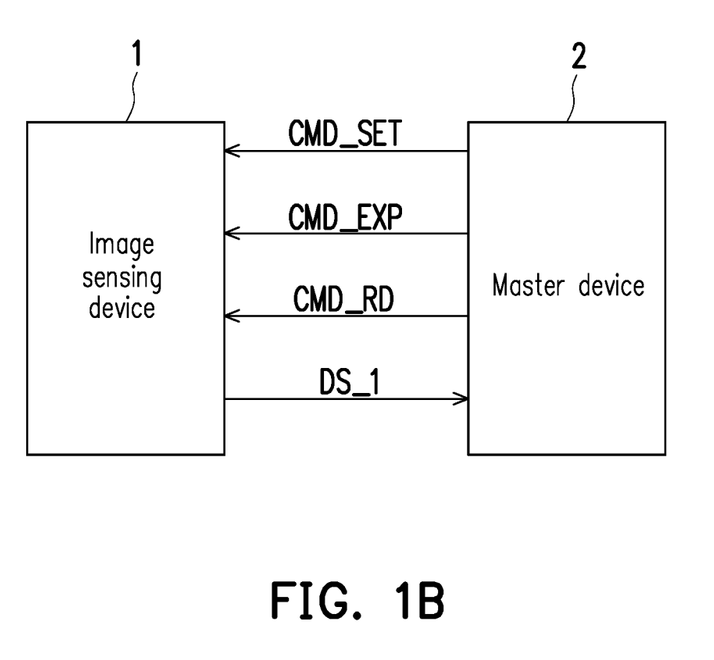
FIG. 1B is a schematic diagram of signal transmission between a master device and an image sensing device of FIG. 1A according to an embodiment of the invention.

FIG. 1A is a block schematic diagram of an image data transmission system according to an embodiment of the invention, and FIG. 1B is a schematic diagram of signal transmission between a master device and an image sensing device of FIG. 1A according to an embodiment of the invention. Referring to FIG. 1A and FIG. 1B, the image data transmission system 10 includes an image sensing device 1, a master device 2 and a serial transmission bus 3. The serial transmission bus 3 electrically connects the image sensing device 1 and the master device 2, and serves as a signal transmission interface between the image sensing device 1 and the master device 2. In detail, the serial transmission bus 3 is coupled to serial transmitting pins of the image sensing device 1 and serial transmitting pins of the master device 2. The master device 2 may transmit a read command CMD_RD to the image sensing device 1 through the serial transmission bus 3, and the image sensing device 1 may transmit a first data sequence DS_1 to the master device 2 through the serial transmission bus 3 in response to the read command CMD_RD, where the first data sequence DS_1 includes image data.

In an embodiment of the invention, the image sensing device 1 is a Charge Coupled Device (CCD), a Complementary Metal-Oxide Semiconductor (CMOS) or other similar device or a combination of the above devices. The master device 2 may be a Central Processing Unit (CPU) or other programmable general use or special use microprocessor, a Digital Signal Processor (DSP), a programmable controller, an Application Specific Integrated Circuit (ASIC) or other similar device or a combination of the above devices. The serial transmission bus 3 may be a Serial Peripheral Interface (SPI) bus, an Inter-Integrated Circuit ($I^2C$) bus, a System Management Bus (SMBus) or other similar serial bus.

Figure 2:
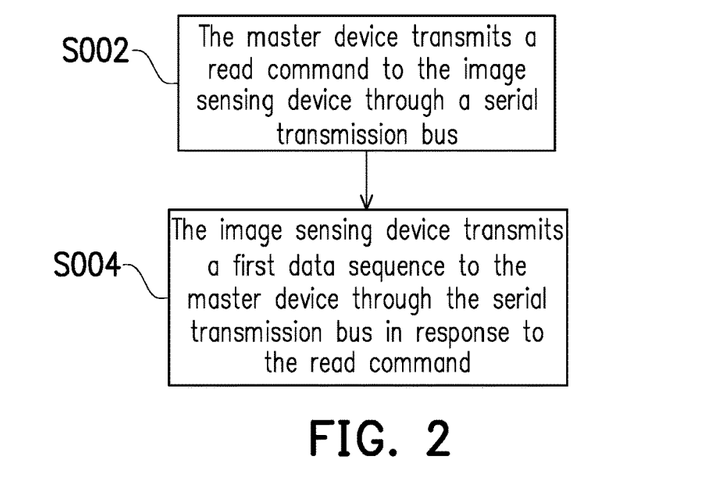
FIG. 2 is a flowchart illustrating an image data transmission method according to an embodiment of the invention.

FIG. 2 is a flowchart illustrating an image data transmission method according to an embodiment of the invention, which is adapted to the image data transmission system 10 of FIG. 1, though the invention is not limited thereto. Referring to FIG. 1A, FIG. 1B and FIG. 2, the image data transmission method includes following steps. First, in step S002, the master device 2 transmits the read command CMD_RD to the image sensing device 1 through the serial transmission bus 3. Then, the image sensing device 1 transmits the first data sequence DS_1 to the master device 2 through the serial transmission bus 3 in response to the read command CMD_RD, shown as a step S004 of FIG. 2.

In an embodiment of the invention, before the master device 2 transmits the read command CMD_RD to the image sensing device 1, the master device 2 may first transmit a setting command CMD_SET to the image sensing device 1 through the serial transmission bus 3 to set exposure related parameters (for example, an exposure time, an aperture value, a luminance value, an ISO index, a correction constant, etc.) of the image sensing device 1, though the invention is not limited thereto. In another embodiment of the invention, the aforementioned exposure related parameters may also be pre-stored in the image sensing device 1, so that the master device 2 may omit transmitting the setting command CMD_SET to the image sensing device 1.

As described above, a start time point when the image sensing device 1 performs exposure is determined by the master device 2. Therefore, the master device 2 may transmit an exposure command CMD_EXP to the image sensing device 1 through the serial transmission bus 3, and the image sensing device 1 performs exposure to generate the image data in response to the exposure command CMD_EXP, though the invention is not limited thereto.

When the master device 2 wants to read the image data generated by the image sensing device 1, the master device 2 may transmit the read command CMD_RD to the image sensing device 1 through the serial transmission bus 3. The image sensing device 1 may embed the image data in the first data sequence DS_1 in response to the read command CMD_RD, and transmit the first data sequence DS_1 to the master device 2 through the serial transmission bus 3. Since the data transmitted through the serial transmission bus 3 is data in a unit of bit, the first data sequence DS_1 is a data sequence in a unit of bit.

It should be noted that the setting command CMD_SET, the exposure command CMD_EXP and the read command CMD_RD transmitted by the master device 2 are determined according to a type of the serial transmission bus 3. For example, if the serial transmission bus 3 is implemented by a SPI bus, the setting command CMD_SET, the exposure command CMD_EXP and the read command CMD_RD transmitted by the master device 2 are compiled in form of SPI instructions.

Since the image sensing device 1 still requires to perform a conversion operation in order to obtain the integral image data and prepare the first data sequence DS_1 after executing exposure, a plurality of embodiments are provided below to allow the master device 2 to effectively determine whether the image sensing device 1 has prepared the first data sequence DS_1.

In an embodiment of the invention, the image sensing device 1 may provide a state of the first data sequence DS_1 for the master device 2 to inquire. Once the image sensing device 1 has obtained the image data and prepared the first data sequence DS_1, the master device 2 may learn that the first data sequence DS_1 has been prepared by inquiring the state of the first data sequence DS_1, and then the master device 2 may transmit the read command CMD_RD to the image sensing device 1 through the serial transmission bus 3. The prepared first data sequence DS_1 may include an integral image frame or a plurality of image frames, and may only include a part of row images in one image frame, which is determined according to an actual application or design requirement.

Figure 3:
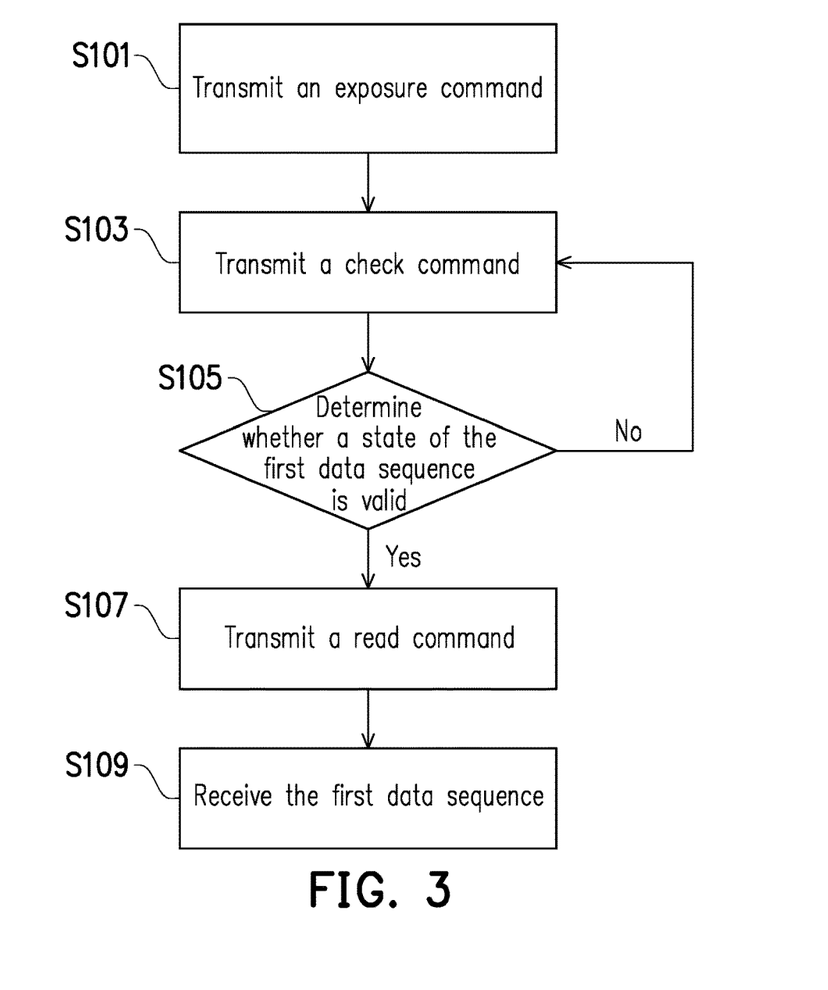
FIG. 3 is a flowchart illustrating an image data transmission method of the master device of FIG. 1A according to an embodiment of the invention.

FIG. 3 is a flowchart illustrating an image data transmission method of the master device 2 of FIG. 1A according to an embodiment of the invention. Referring to FIG. 1A, FIG. 1B and FIG. 3, in step S101, the master device 2 transmits the exposure command CMD_EXP to the image sensing device 1 through the serial transmission bus 3, and the image sensing device 1 performs exposure and generates the first data sequence DS_1 in response to the exposure command CMD_EXP. In step S103, the master device 2 transmits a check command to the image sensing device 1 through the serial transmission bus 3, so as to detect a state of the first data sequence DS_1.

In an embodiment of the invention, the image sensing device 1 may have a storage (not shown), where the image sensing device 1 may store the states of the first data sequence DS_1 in the storage by using different codes, and the master device 2 may determine whether the first data sequence DS_1 is ready by inquiring the code in the storage of the image sensing device 1. For example, when the first data sequence DS_1 is ready, the image sensing device 1 may write a first code into the storage to represent that the first data sequence DS_1 is ready, otherwise, the image sensing device 1 may write a second code into the storage to represent that the first data sequence DS_1 is not ready, where the first code and the second code are different. Therefore, the master device 2 may read the content of the storage through the serial transmission bus 3, and determine whether the first data sequence DS_1 is ready according to the content of the storage. In an embodiment of the invention, the first code and the second code are, for example, different bit values.

In an embodiment of the invention, the aforementioned storage may be a register, any type of static or dynamic Random Access Memory (RAM), a flash memory, a Hard Disk Drive (HDD), a Solid State Drive (SSD) or a similar device or a combination of the above devices.

In another embodiment of the invention, when the image sensing device 1 receives the check command transmitted by the master device 2 through the serial transmission bus 3, the image sensing device 1 may transmit the state of the first data sequence DS_1 to the master device 2 through the serial transmission bus 3 in response to the check command.

Further, when the first data sequence DS_1 is ready, the image sensing device 1 sets the state of the first data sequence DS_1 to be valid, otherwise, the image sensing device 1 sets the state of the first data sequence DS_1 to be invalid. The master device 2 determines whether the state of the first data sequence DS_1 is valid through inquiring, shown as a step S105. If the state of the first data sequence DS_1 is invalid, the flow returns to the step S103. If the state of the first data sequence DS_1 is valid, the master device 2 transmits the read command CMD_RD to the image sensing device 1 through the serial transmission bus 3, shown as a step S107.

When the image sensing device 1 receives the read command CMD_RD transmitted by the master device 2, the image sensing device 1 outputs the first data sequence DS_1 in response to the read command CMD_RD, and the master device 2 may receive the first data sequence DS_1 through the serial transmission bus 3, shown as a step S109.

According to the above method, the master device 2 first checks whether the image sensing device 1 prepares the first data sequence DS_1, and then transmits the read command CMD_RD to the image sensing device 1, in this way, it is guaranteed that the image data in the first data sequence DS_1 received by the master device 2 is valid.

In another embodiment of the invention, the image sensing device 1 does not provide the state of the first data sequence DS_1 in advance, but embed the state of the first data sequence DS_1 in the first data sequence DS_1. The master device 2 may continuously transmit the read command CMD_RD to the image sensing device 1 through the serial transmission bus 3 at any time. When the image sensing device 1 transmits the first data sequence DS_1 to the master device 2 through the serial transmission bus 3 in response to the read command CMD_RD, the master device 2 may determine the state of the first data sequence DS_1 only according to the received first data sequence DS_1.

Figure 4:
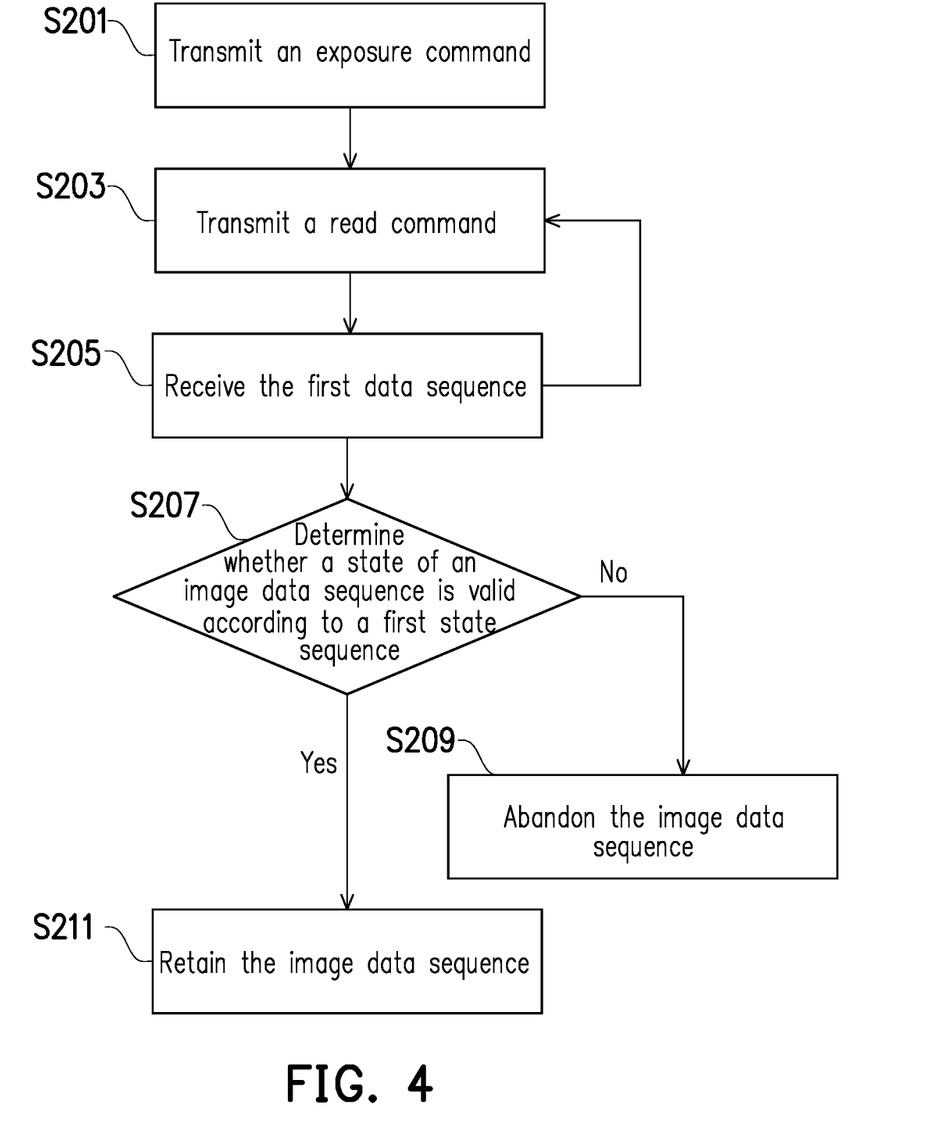
FIG. 4 is a flowchart illustrating an image data transmission method of the master device of FIG. 1A according to another embodiment of the invention.

FIG. 4 is a flowchart illustrating an image data transmission method of the master device 2 of FIG. 1A according to another embodiment of the invention. Referring to FIG. 1A, FIG. 1B and FIG. 4, in step S201, the master device 2 transmits the exposure command CMD_EXP to the image sensing device 1 through the serial transmission bus 3. The image sensing device 1 performs exposure in response to the exposure command CMD_EXP and generates the first data sequence DS_1.

In an embodiment of the invention, the first data sequence DS_1 includes an image data sequence and a first state sequence, where the first state sequence is used for representing a state of the image data sequence. When the image sensing device 1 generates the first data sequence DS_1, the image sensing device 1 additionally embeds the first state sequence associated with the state of the image data sequence into the first data sequence DS_1.

Figure 5A:
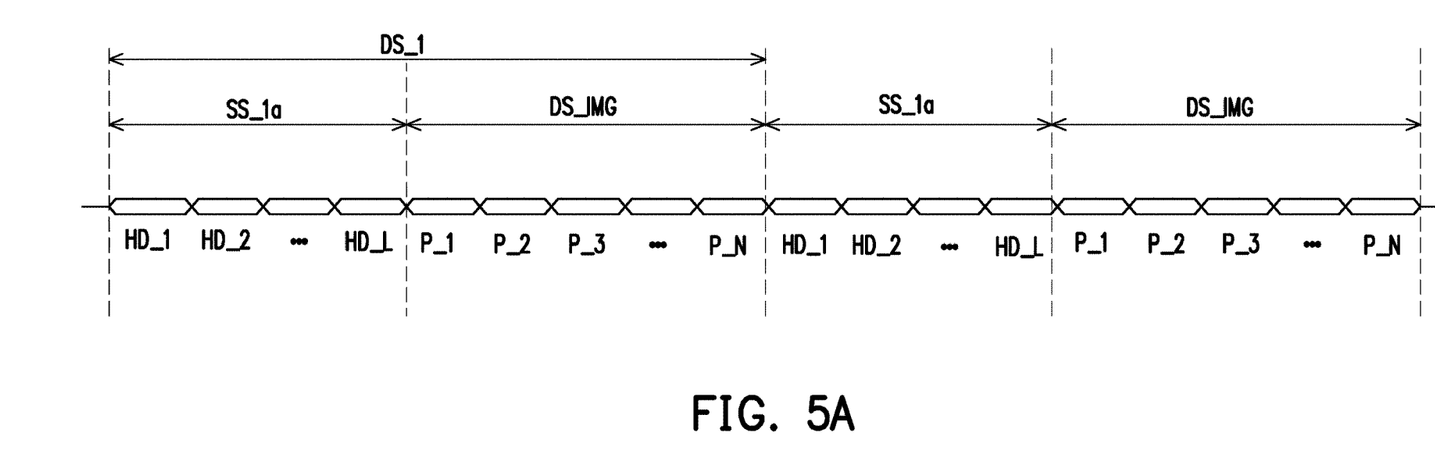
FIG. 5A is a schematic diagram of a first data sequence of FIG. 4 according to an embodiment of the invention.

FIG. 5A is a schematic diagram of a first data sequence of FIG. 4 according to an embodiment of the invention. Referring to FIG. 1A, FIG. 4 and FIG. 5A. A first state sequence SS_1$a$ in the first data sequence DS_1 includes header bits HD_1, HD_2, . . . , HD_L, and the image data sequence DS_IMG includes image bits P_1, P_2, . . . , P_N, where the first state sequence SS_1$a$ is configured in front of the image data sequence DS_IMG.

Figure 5B:
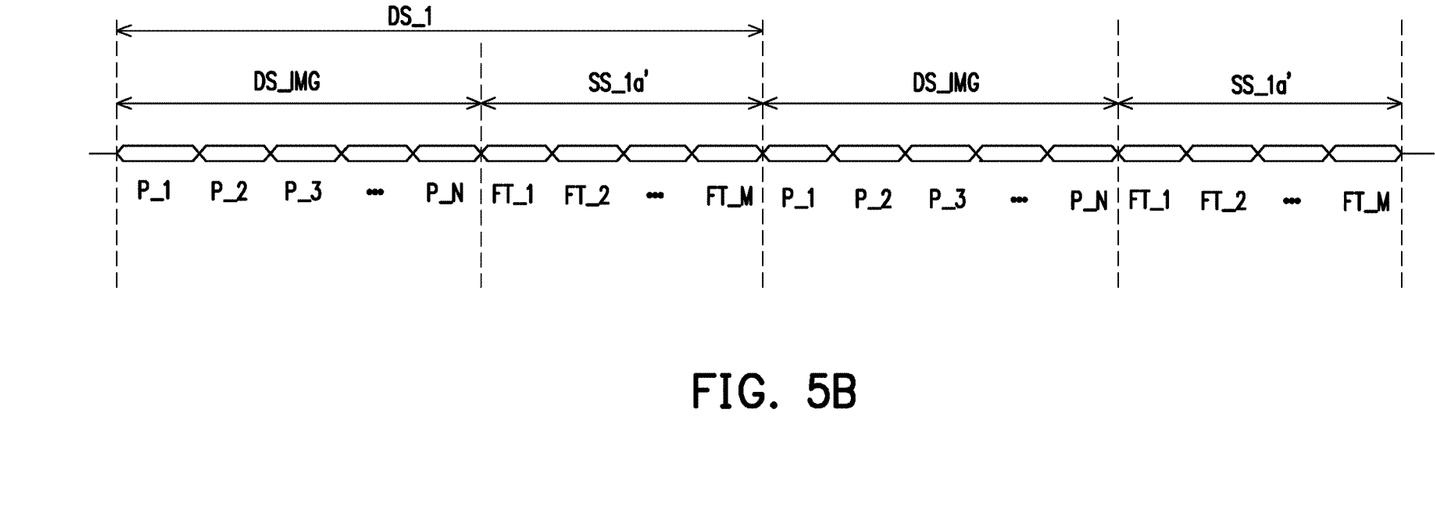
FIG. 5B is a schematic diagram of the first data sequence of FIG. 4 according to another embodiment of the invention.

FIG. 5B is a schematic diagram of the first data sequence of FIG. 4 according to another embodiment of the invention. Compared to the embodiment of FIG. 5A that the first state sequence SS_1$a$ is configured in front of the image data sequence DS_IMG, the first state sequence SS_1$a'$ of FIG. 5B is configured behind the image data sequence DS_IMG, and the first state sequence SS_1$a'$ of the first data sequence DS_1 includes footer bits FT_1, FT_2, . . . , FT_M.

Figure 5C:
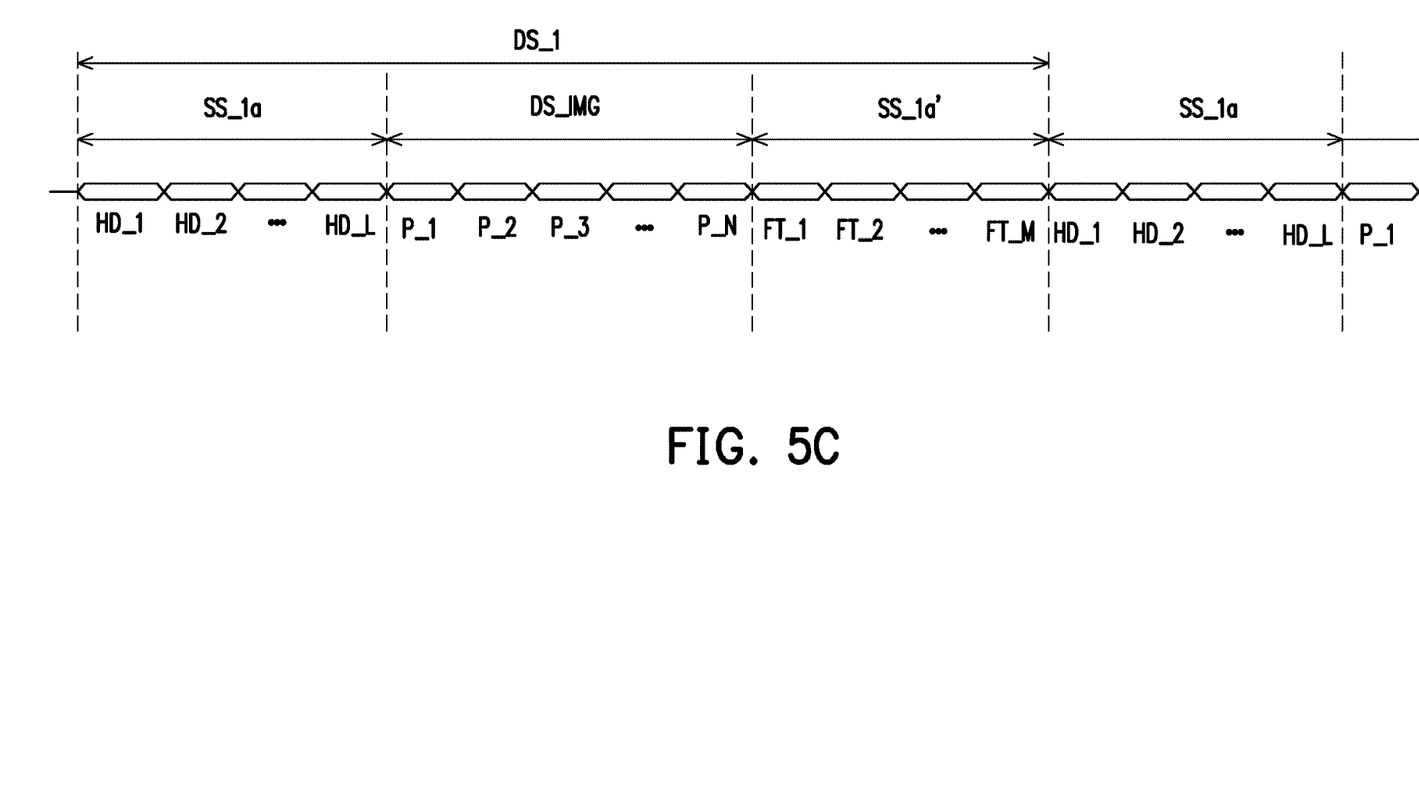
FIG. 5C is a schematic diagram of the first data sequence of FIG. 4 according to still another embodiment of the invention.

FIG. 5C is a schematic diagram of the first data sequence of FIG. 4 according to still another embodiment of the invention. A difference between the first data sequence DS_1 of FIG. 5C and the first data sequence DS_1 of FIG. 5A is that the first data sequence DS_1 of FIG. 5C further includes a first state sequence SS_1$a'$, where the first state sequence SS_1$a'$ is configured behind the image data sequence DS_IMG, and the first state sequence SS_1$a'$ includes footer bits FT_1, FT_2, . . . , FT_M.

The master device 2 may determine whether the image data sequence DS_IMG is a valid image or invalid image according to at least one of the first state sequence SS_1$a$ and the first state sequence SS_1$a'$. Moreover, the exposure related parameters may also be set to at least one of the first state sequence SS_1$a$ and the first state sequence SS_1$a'$. It should be noted that a data length (i.e. bit number) of the first state sequences SS_1$a$, SS_1$a'$ may be determined according to an actual application or design requirement of the image sensing device 1 and the master device 2, as long as the master device 2 may interpret the first state sequences SS_1a, SS_1a'.

Referring to FIG. 1A, FIG. 1B, FIG. 4 and FIG. 5A, in step S203, the master device 2 transmits the read command CMD_RD to the image sensing device 1 through the serial transmission bus 3. When the image sensing device 1 receives the read command CMD_RD transmitted by the master device 2, the image sensing device 1 outputs the first data sequence DS_1 through the serial transmission bus 3 in response to the read command CMD_RD. In step S205, the master device 2 receives the first data sequence DS_1. In an embodiment of the invention, in the step S203, the master device 2 may continually transmit a plurality of read commands CMD_RD to the image sensing device 1 through the serial transmission bus 3.

In step S207, the master device 2 determines whether the state of the image data sequence DS_IMG in the first data sequence DS_1 is valid according to the first state sequence SS_1a. If the state of the image data sequence DS_IMG in the first data sequence DS_1 is invalid, in step S209, the master device 2 abandons the image data sequence DS_IMG in the first data sequence DS_1; if the state of the image data sequence DS_IMG in the first data sequence DS_1 is valid, in step S211, the master device 2 retains the image data sequence DS_IMG in the first data sequence DS_1.

When the image sensing device 1 generates the first data sequence DS_1, the image sensing device 1 additionally embeds the aforementioned header bits HD_1, HD_2, . . . , HD_L and/or the footer bits FT_1, FT_2, . . . , FT_M in the first data sequence DS_1, and an advantage thereof is that the master device 2 may determine the state of the first data sequence DS_1 according to the received first data sequence DS_1. However, such method may increase a data amount of the first data sequence DS_1, and increase a burden of image data transmission.

Figure 6:
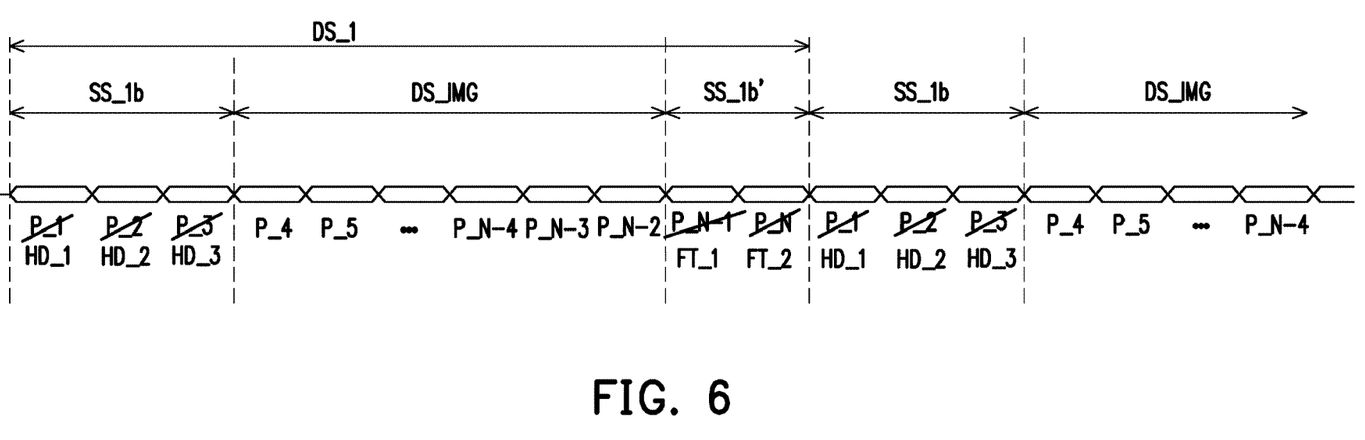
FIG. 6 is a schematic diagram of the first data sequence of FIG. 4 according to still another embodiment of the invention.

FIG. 6 is a schematic diagram of the first data sequence of FIG. 4 according to still another embodiment of the invention. Referring to FIG. 1A, FIG. 1B, FIG. 4 and FIG. 6, the first data sequence DS_1 includes the image data sequence DS_IMG, a first state sequence SS_1b and a first state sequence SS_1b'. The image data sequence DS_IMG includes image bits P_4, P_5, . . . , P_N-4, P_N-3, P_N-2. The first state sequence SS_1b includes 3 header bits HD_1, HD_2 and HD_3, and the first state sequence SS_1b' includes 2 footer bits FT_1 and FT_2, where the 3 header bits HD_1, HD_2 and HD_3 sequentially substitute the front 3 image bits P_1, P_2 and P_3 in the original image data sequence, and the 2 footer bits FT_1 and FT_2 sequentially substitute the posterior 2 image bits P_N-1, P_N in the original image data sequence. In this way, the data amount of the first data sequence DS_1 is equal to the data amount of the original image data sequence. Moreover, a data length (i.e. bit number) of the first state sequences SS_1b, SS_1b' may be determined according to an actual application or design requirement of the image sensing device 1 and the master device 2, as long as the master device 2 may interpret the first state sequences SS_1b, SS_1b'.

When the master device 2 wants to process the image data sequence DS_IMG, the master device 2 may replace the image bits P_1, P_2, P_3, P_N-1, P_N substituted by the header bits HD_1, HD_2 and HD_3 and the footer bits FT_1 and FT_2 by black margins, or use an algorithm to process the image bits P_1, P_2, P_3, P_N-1, P_N substituted by the header bits HD_1, HD_2 and HD_3 and the footer bits FT_1 and FT_2. In this way, not only almost complete image data is maintained, the data amount of the first data sequence DS_1 may be maintained the same to the data mount of the original data sequence.

When the image sensing device 1 does not prepare the first data sequence DS_1 but receives the read command CMD_RD transmitted by the master device 2, the image sensing device 1 transmits the first data sequence DS_1 with the invalid image to the master device 2. Since a transmission amount of the first data sequence DS_1 with the invalid image is probably rather large, not only a considerable amount of transmission time is consumed, during the process of transmitting the first data sequence DS_1 with the invalid image, the subsequent first data sequence DS_1 with the valid image probably has been prepared, but it is still required to wait for transmission of the first data sequence DS_1 with the invalid image before transmitting the subsequent first data sequence DS_1. In order to save the time consumed for transmitting the aforementioned invalid image, in another embodiment of the invention, when the image sensing device 1 does not prepare the first data sequence DS_1 but receives the read command CMD_RD transmitted by the master device 2, the image sensing device 1 embeds a specific amount of dummy data in the data sequence. After the master device 2 receives the data sequence, the master device 2 may directly abandons the specific amount of dummy data.

Figure 7:
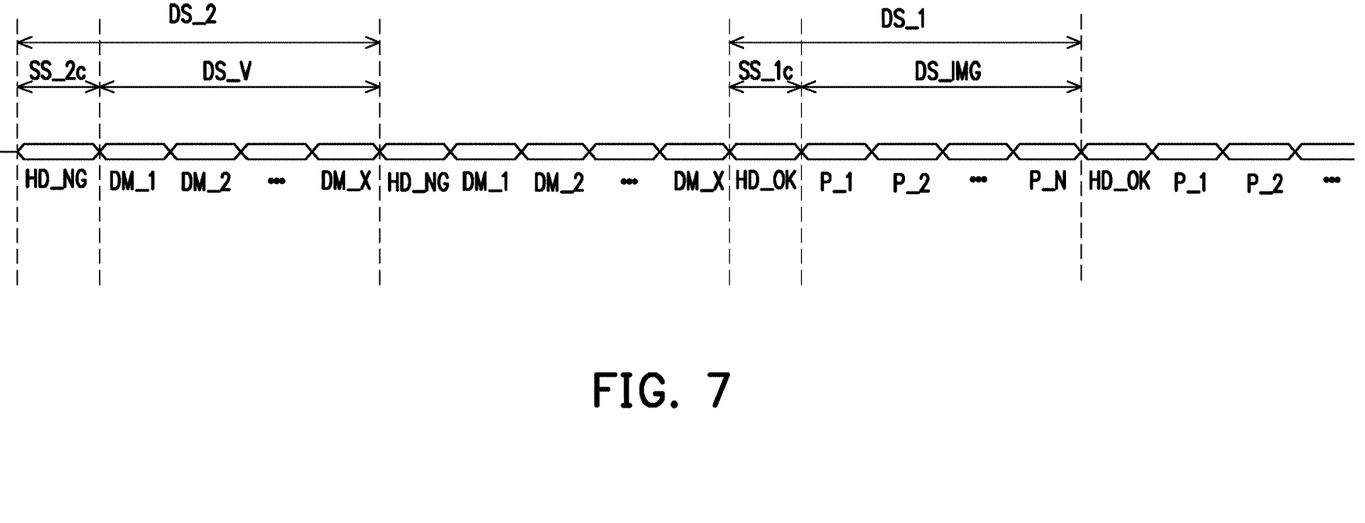
FIG. 7 is a schematic diagram of the first data sequence of FIG. 4 according to still another embodiment of the invention.

FIG. 7 is a schematic diagram of the first data sequence of FIG. 4 according to still another embodiment of the invention. Referring to FIG. 1A, FIG. 1B, FIG. 4 and FIG. 7. When the first data sequence DS_1 is not ready, the image sensing device 1 transmits a second data sequence DS_2 to the master device 2 in response to the read command CMD_RD. The second data sequence DS_2 includes a second state sequence SS_2c and a dummy data sequence DS_V, where the second state sequence SS_2c has a header bit HD_NG, and the dummy data sequence DS_V has dummy bits DM_1, DM_2, . . . , DM_X, and the second state sequence SS_2c is used for representing that the dummy data sequence DS_V is invalid.

When the first data sequence DS_1 is ready, the image sensing device 1 transmits the first data sequence DS_1 to the master device 2 in response to the read command CMD_RD. The first data sequence DS_1 includes a first state sequence SS_1c and an image data sequence DS_IMG, where the first state sequence SS_1c has a header bit HD_OK, and the image data sequence DS_IMG has image bits P_1, P_2, . . . , P_N, and the first state sequence SS_1c is used for representing that the image data sequence DS_IMG is valid.

In an embodiment of the invention, the image sensing device 1 may always embed a fixed number of dummy bits DM_1, DM_2, . . . , DM_X in the second data sequence DS_2, for example, the image sensing device 1 fixedly embeds 1024 dummy bits in the second data sequence DS_2. In this way, the master device 2 may directly abandon the received fixed number of dummy bits DM_1, DM_2, . . . , DM_X.

In another embodiment of the invention, the master device 2 may set the image sensing device 1 to decide the number of the dummy bits DM_1, DM_2, . . . , DM_X embedded in the second data sequence DS_2 by the image sensing device 1.

Figure 8:
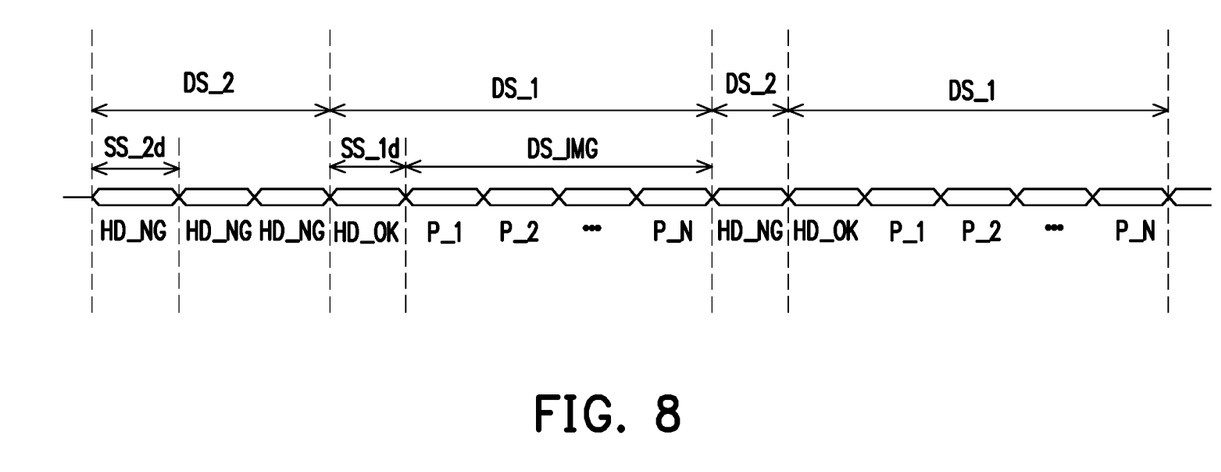
FIG. 8 is a schematic diagram of the first data sequence of FIG. 4 according to still another embodiment of the invention.

FIG. 8 is a schematic diagram of the first data sequence of FIG. 4 according to still another embodiment of the invention. Referring to FIG. 1A, FIG. 1B, FIG. 4 and FIG. 8, when the first data sequence DS_1 is not ready, the image sensing device 1 transmits the second data sequence DS_2 to the master device 2 in response to the read command CMD_RD, so as to notify the master device 2 that the first data sequence DS_1 is not ready, where the second data sequence DS_2 has at least one second state sequence SS_2d, and each of the second state sequences SS_2d may be represented by a header bit HD_NG. When the master device 2 receives the second data sequence DS_2, since the master device 2 interprets that the second data sequence DS_2 has the header bit HD_NG, the master device 2 may directly skip the second data sequence DS_2 and continually interpret a next data sequence.

Comparatively, when the first data sequence DS_1 is ready, the image sensing device 1 transmits the first data sequence DS_1 to the master device 2 in response to the read command CMD_RD. The first data sequence DS_1 includes a first state sequence SS_1d and an image data sequence DS_IMG, where the first state sequence SS_1d has the header bit HD_OK, and the image data sequence DS_IMG has the image bits P_1, P_2, . . . , P_N, and the first state sequence SS_1d is used for representing that the image data sequence DS_IMG is valid.

After the image sensing device 1 performs exposure, the image sensing device 1 first generates a corresponding analog signal, and then converts the analog signal into a digital signal through an Analog-Digital Converter (ADC), so as to generate the first data sequence DS_1. During the process of converting the analog signal into the digital signal, if a pixel value of each pixel is recorded in 8 bits, a pixel value of the strongest light is, for example, 00, and a pixel value of the weakest light is, for example, FF. Generally, the pixel values of 00 and FF are hardly appeared on application of the master device 2, so that the image sensing device 1 may set the pixel value of 00 or FF as a reserved value, or set the pixel value that is not appeared on the application of the master device 2 or an insensitive value as the reserved value.

Figure 9:
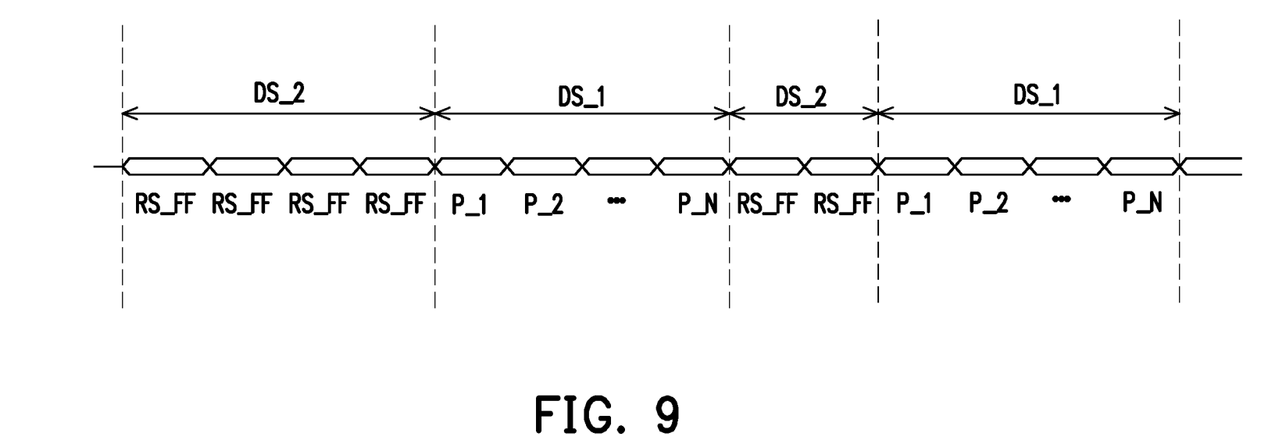
FIG. 9 is a schematic diagram of the first data sequence of FIG. 4 according to still another embodiment of the invention.

FIG. 9 is a schematic diagram of the first data sequence of FIG. 4 according to still another embodiment of the invention. Referring to FIG. 1A, FIG. 1B, FIG. 4 and FIG. 9, when the first data sequence DS_1 is not ready, the image sensing device 1 transmits the second data sequence DS_2 to the master device 2 in response to the read command CMD_RD, so as to notify the master device 2 that the first data sequence DS_1 is not ready, where the second data sequence DS_2 has at least one reserved value RS_FF.

When the first data sequence DS_1 is ready, the image sensing device 1 transmits the first data sequence DS_1 to the master device 2 in response to the read command CMD_RD, where the first data sequence DS_1 includes an image data sequence having the image bits P_1, P_2, . . . , P_N.

In other words, the master device 2 may take the reserved value RS_FF as a feature value from a series of data sequences transmitted by the image sensing device 1 through the serial transmission bus 3, and the first data sequence DS_1 entrained between the feature values has the valid image data. The master device 2 may directly abandon the second data sequence DS_2 having the reserved value RS_FF, and only retain image data other than the second data sequence DS_2 having the reserved value RS_FF.

Figure 10:
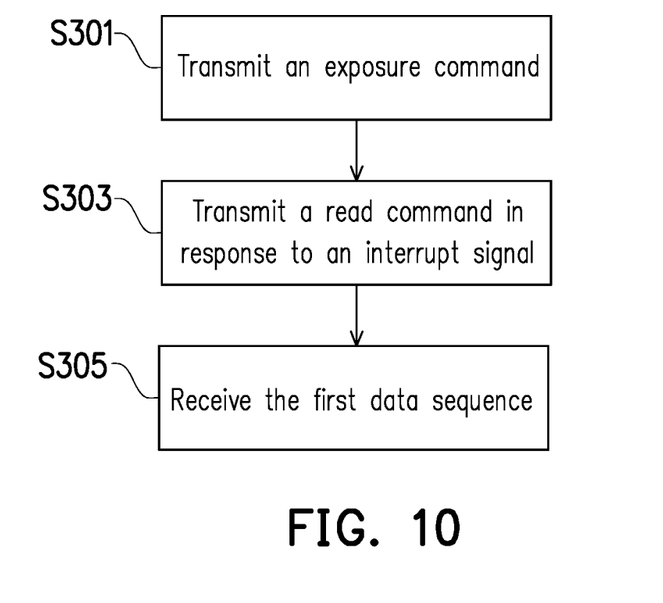
FIG. 10 is a flowchart illustrating an image data transmission method of the master device of FIG. 1A according to still another embodiment of the invention.

In still another embodiment of the invention, when the image sensing device 1 has prepared the first data sequence DS_1, the image sensing device 1 may notify the master device 2 that the first data sequence DS_1 is ready by triggering an interrupt notification. FIG. 10 is a flowchart illustrating an image data transmission method of the master device 2 of FIG. 1A according to still another embodiment of the invention. Referring to FIG. 1A, FIG. 1B and FIG. 10, in step S301, the master device 2 transmits the exposure command CMD_EXP to the image sensing device 1 through the serial transmission bus 3, and the image sensing device 1 performs exposure in response to the exposure command CMD_EXP, and generates the first data sequence DS_1. When the first data sequence DS_1 is ready, the image sensing device 1 sets the state of the first data sequence DS_1 as valid, and the image sensing device 1 transmits an interrupt signal to the master device 2 through the serial transmission bus 3, so as to notify the master device 2 that the first data sequence DS_1 is ready.

When the master device 2 receives the interrupt signal transmitted by the image sensing device 1 through the serial transmission bus 3, in step S303, the master device 2 transmits the read command CMD_RD to the image sensing device 1 through the serial transmission bus 3 in response to the interrupt signal. The image sensing device 1 transmits the first data sequence DS_1 to the master device 2 through the serial transmission bus 3 in response to the read command CMD_RD. In step S305, the master device 2 receives the first data sequence DS_1.

Figure 11:
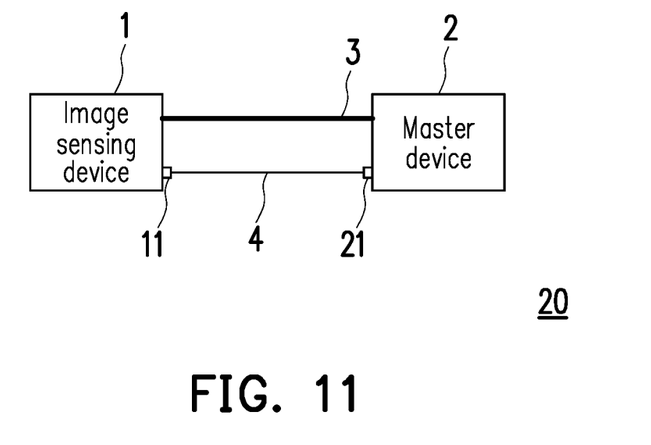
FIG. 11 is a block schematic diagram of an image data transmission system according to another embodiment of the invention.
Figure 12:
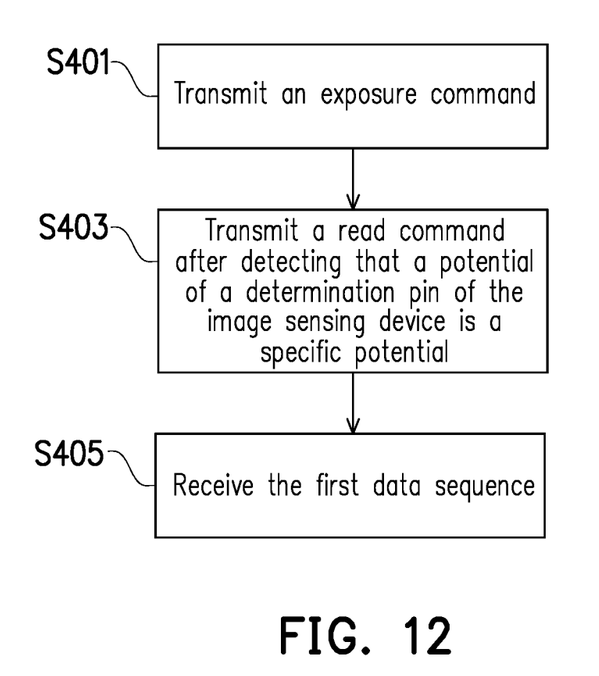
FIG. 12 is a flowchart illustrating an image data transmission method of the master device of FIG. 11 according to an embodiment of the invention.

FIG. 11 is a block schematic diagram of an image data transmission system according to still another embodiment of the invention. FIG. 12 is a flowchart illustrating an image data transmission method of the master device 2 of FIG. 11 according to still another embodiment of the invention. Referring to FIG. 1B, FIG. 11 and FIG. 12. In another embodiment of the invention, the image data transmission system 20 includes an image sensing device 1, a master device 2 and a serial transmission bus 3, where the image sensing device 1 includes a determination pin 11, and the determination pin 11 is electrically connected to a detection pin 21 of the master device 2 through a wire 4.

In step S401, the master device 2 transmits the exposure command CMD_EXP to the image sensing device 1 through the serial transmission bus 3. The image sensing device 1 performs exposure in response to the exposure command CMD_EXP and generates the first data sequence DS_1. When the first data sequence DS_1 is ready, the image sensing device 1 sets the state of the first data sequence DS_1 to be valid.

When the image sensing device 1 has prepared the first data sequence DS_1, the image sensing device 1 drives a potential of the determination pin 11 to a specific potential. In step S403, after the master device 2 detects that the potential of the determination pin 11 is the specific potential through the wire 4 and the detection pin 21, the master device 2 transmits the read command CMD_RD to the image sensing device 1 through the serial transmission bus 3. The image sensing device 1 transmits the first data sequence DS_1 to the master device 2 through the serial transmission bus 3 in response to the read command CMD_RD. In step S405, the master device 2 receives the first data sequence DS_1.

In another embodiment of the invention, the image sensing device 1 may also transmit the interrupt signal to the master device 2 through the determination pin 11 via the wire 4. Implementation detail of triggering the interruption may refer to related description of the embodiment of FIG. 10, and detail thereof is not repeated.

In summary, since the image data transmission system and the image data transmission method of the embodiments of the invention adopt the serial transmitting interface, the number of pins of the image sensing device used for transmitting image data is greatly reduced. Moreover, the master device is adapted to actively send the read command to the image sensing device, so as to grasp a time point for image data transmission, and effectively determine whether the image data is valid.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. An image data transmission system, comprising:
an image sensing device;
a master device; and
a serial transmission bus, electrically connecting the image sensing device and the master device,
wherein the master device transmits a read command to the image sensing device through the serial transmission bus, and the image sensing device transmits a first data sequence to the master device through the serial transmission bus in response to the read command,
wherein the first data sequence comprises:
an image data sequence; and
a first state sequence, configured to indicate whether the image data sequence is valid,
wherein when the first data sequence is not ready, the image sensing device transmits a second data sequence including a preset number of dummy bits to the master device in response to the read command,
wherein the second data sequence further comprises a second state sequence configured to represent that the preset number of dummy bits is invalid, and the preset number of dummy bits is configured to be transmitted between the first state sequence and the second state sequence.

2. The image data transmission system as claimed in claim 1, wherein before the master device transmits the read command to the image sensing device, the master device transmits an exposure command to the image sensing device through the serial transmission bus, and the image sensing device performs exposure in response to the exposure command and generates the first data sequence.

3. The image data transmission system as claimed in claim 2, wherein the image sensing device comprises a storage,
wherein when the first data sequence is ready, the image sensing device writes a first code into the storage to represent that the first data sequence is ready, otherwise, the image sensing device writes a second code into the storage to represent that the first data sequence is not ready, wherein the first code and the second code are different,
wherein before the master device transmits the read command to the image sensing device, the master device further reads content of the storage through the serial transmission bus, and determines whether the first data sequence is ready according to the content of the storage.

4. The image data transmission system as claimed in claim 2, wherein
before the master device transmits the read command to the image sensing device, the master device further transmits a check command to the image sensing device through the serial transmission bus, and the image sensing device transmits a state of the first data sequence to the master device through the serial transmission bus in response to the check command,
wherein when the master device checks that the state of the first data sequence is valid, the master device transmits the read command to the image sensing device through the serial transmission bus, and otherwise the master device again transmits the check command to the image sensing device.

5. The image data transmission system as claimed in claim 2, wherein
when the first data sequence is ready, the image sensing device transmits the first data sequence to the master device in response to the read command,
when the first data sequence is not ready, the image sensing device continuously transmits a reserved value to the master device in response to the read command.

6. The image data transmission system as claimed in claim 2, wherein
when the first data sequence is ready, the image sensing device transmits an interrupt signal to the master device, and the master device transmits the read command to the image sensing device in response to the interrupt signal.

7. The image data transmission system as claimed in claim 2, wherein the image sensing device comprises:
a determination pin, electrically connected to the master device,
when the first data sequence is ready, the image sensing device drives a potential of the determination pin to a specific potential, and the master device transmits the read command to the image sensing device after detecting that the potential of the determination pin is the specific potential.

8. The image data transmission system as claimed in claim 1, wherein the first state sequence comprises at least one of at least one header bit and at least one footer bit, wherein the at least one header bit is configured in front of the image data sequence, and the at least one footer bit is configured behind the image data sequence.

9. The image data transmission system as claimed in claim 1, wherein the first state sequence comprises at least one of at least one header bit and at least one footer bit, wherein the at least one header bit is configured to substitute at least one bit in the front of the image data sequence, and the at least one footer bit is configured to substitute at least one bit at posterior of the image data sequence.

10. The image data transmission system as claimed in claim 1, wherein
when the first data sequence is ready, the first state sequence is configured to represent that the image data sequence is valid, and the image sensing device transmits the first data sequence to the master device in response to the read command.

11. The image data transmission system as claimed in claim 10, wherein
when the first data sequence is not ready, the image sensing device transmits the second state sequence to the master device in response to the read command, so as to notify the master device that the first data sequence is not ready.

12. An image data transmission method, comprising:
transmitting a read command to an image sensing device by a master device through a serial transmission bus;
transmitting a first data sequence to the master device by the image sensing device through the serial transmission bus in response to the read command, wherein the first data sequence comprises an image data sequence and a first state sequence, and the first state sequence is configured to indicate whether the image data sequence is valid; and when the first data sequence is not ready, transmitting a second data sequence including a preset number of dummy bits to the master device by the image sensing device in response to the read command, wherein the second data sequence further comprises a second state sequence configured to represent that the preset number of dummy bits is invalid, wherein the preset number of dummy bits is configured to be transmitted between the first state sequence and the second state sequence.

13. The image data transmission method as claimed in claim 12, further comprising:

before transmitting the read command to the image sensing device by the master device, transmitting an exposure command to the image sensing device by the master device through the serial transmission bus, such that the image sensing device performs exposure in response to the exposure command and generates the first data sequence.

14. The image data transmission method as claimed in claim 13, further comprising:

when the first data sequence is ready, writing a first code into a storage of the image sensing device by the image sensing device to represent that the first data sequence is ready, otherwise, writing a second code into the storage by the image sensing device to represent that the first data sequence is not ready, wherein the first code and the second code are different; and before transmitting the read command to the image sensing device by the master device, further reading content of the storage by the master device through the serial transmission bus, and determining whether the first data sequence is ready according to the content of the storage.

15. The image data transmission method as claimed in claim 13, further comprising:

before transmitting the read command to the image sensing device by the master device, further transmitting a check command to the image sensing device by the master device through the serial transmission bus, such that the image sensing device transmits a state of the first data sequence to the master device through the serial transmission bus in response to the check command, wherein when the master device checks that the state of the first data sequence is valid, the master device transmits the read command to the image sensing device through the serial transmission bus, and otherwise the master device again transmits the check command to the image sensing device.

16. The image data transmission method as claimed in claim 13, further comprises:

determining whether the image data sequence is valid by the master device according to the first state sequence.

17. The image data transmission method as claimed in claim 16, wherein the first state sequence comprises at least one of at least one header bit and at least one footer bit, wherein the at least one header bit is configured in front of the image data sequence, and the at least one footer bit is configured behind the image data sequence.

18. The image data transmission method as claimed in claim 16, wherein the first state sequence comprises at least one of at least one header bit and at least one footer bit, wherein the at least one header bit is configured to substitute at least one bit in the front of the image data sequence, and the at least one footer bit is configured to substitute at least one bit at posterior of the image data sequence.

19. The image data transmission method as claimed in claim 16, further comprising:

when the first data sequence is ready, the first state sequence is configured to represent that the image data sequence is valid; and transmitting the first data sequence to the master device by the image sensing device in response to the read command.

20. The image data transmission method as claimed in claim 19, further comprising:

when the first data sequence is not ready, transmitting the second state sequence to the master device by the image sensing device in response to the read command, so as to notify the master device that the first data sequence is not ready.

21. The image data transmission method as claimed in claim 13, further comprising:

when the first data sequence is ready, transmitting the first data sequence to the master device by the image sensing device in response to the read command; and when the first data sequence is not ready, continuously transmitting a reserved value to the master device by the image sensing device in response to the read command.

22. The image data transmission method as claimed in claim 13, further comprising:

when the first data sequence is ready, transmitting an interrupt signal to the master device by the image sensing device, such that the master device transmits the read command to the image sensing device in response to the interrupt signal.

23. The image data transmission method as claimed in claim 13, wherein the image sensing device further comprises a determination pin, and the image data transmission method further comprises:

when the first data sequence is ready, driving a potential of the determination pin to a specific potential by the image sensing device, such that the master device transmits the read command to the image sensing device after detecting that the potential of the determination pin is the specific potential.

\* \* \* \* \*